United States Patent
Liu et al.

(10) Patent No.: US 8,225,501 B2
(45) Date of Patent: Jul. 24, 2012

(54) METHOD FOR MAKING THERMOACOUSTIC DEVICE

(75) Inventors: Liang Liu, Beijing (CN); Zhuo Chen, Beijing (CN); Kai Liu, Beijing (CN); Chen Feng, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 294 days.

(21) Appl. No.: 12/756,032

(22) Filed: Apr. 7, 2010

(65) Prior Publication Data
US 2011/0031218 A1    Feb. 10, 2011

Related U.S. Application Data

(63) Continuation of application No. 12/719,816, filed on Mar. 8, 2010.

(30) Foreign Application Priority Data

Aug. 7, 2009    (CN) .......................... 2009 1 0109570

(51) Int. Cl.
*H05K 3/02*    (2006.01)
*H05K 3/10*    (2006.01)
(52) U.S. Cl. ............. 29/846; 29/830; 381/164; 310/334
(58) Field of Classification Search .................... 29/830, 29/831, 846–848; 181/164; 310/334; 367/140; 381/164
See application file for complete search history.

(56) References Cited

U.S. PATENT DOCUMENTS

| | | | |
|---|---|---|---|
| 1,528,774 A | 3/1925 | Kranz | |
| 4,002,897 A | 1/1977 | Kleinman et al. | |
| 4,334,321 A | 6/1982 | Edelman | |
| 4,503,564 A | 3/1985 | Edelman et al. | |
| 4,641,377 A | 2/1987 | Rush et al. | |
| 4,766,607 A | 8/1988 | Feldman | |
| 5,694,477 A | 12/1997 | Kole | |
| 6,473,625 B1 | 10/2002 | Williams et al. | |
| 6,777,637 B2 | 8/2004 | Nakayama et al. | |
| 6,803,116 B2 | 10/2004 | Ikeda | |
| 6,808,746 B1 | 10/2004 | Dai et al. | |
| 6,921,575 B2 | 7/2005 | Horiuchi et al. | |
| 7,045,108 B2 | 5/2006 | Jiang et al. | |

(Continued)

FOREIGN PATENT DOCUMENTS

CN    2425468    3/2001

(Continued)

OTHER PUBLICATIONS

Chen, Huxiong; Diebold, Gerald, "Chemical Generation of Acoustic Waves: A Giant Photoacoustic Effect", Nov. 10, 1995, Science, vol. 270, pp. 963-966.

(Continued)

*Primary Examiner* — Donghai D. Nguyen
(74) *Attorney, Agent, or Firm* — Altis Law Group, Inc.

(57) ABSTRACT

The present invention relates to a method for making a thermoacoustic device. The method includes the following steps. A substrate with a surface is provided. A plurality of microspaces is formed on the surface of the substrate. A sacrifice layer is fabricated to fill the microspaces. A metal film is deposited on the sacrifice layer, and the sacrifice layer is removed. A signal input device is provided to electrically connect with the metal film.

13 Claims, 4 Drawing Sheets

U.S. PATENT DOCUMENTS

| | | | |
|---|---|---|---|
| 7,393,428 | B2 | 7/2008 | Huang et al. |
| 7,474,590 | B2 | 1/2009 | Watabe et al. |
| 7,723,684 | B1 | 5/2010 | Haddon et al. |
| 7,799,163 | B1 | 9/2010 | Mau et al. |
| 2001/0005272 | A1 | 6/2001 | Buchholz |
| 2001/0048256 | A1 | 12/2001 | Miyazaki et al. |
| 2002/0076070 | A1 | 6/2002 | Yoshikawa et al. |
| 2005/0040371 | A1 | 2/2005 | Watanabe et al. |
| 2005/0201575 | A1 | 9/2005 | Koshida et al. |
| 2006/0104451 | A1 | 5/2006 | Browning et al. |
| 2006/0147081 | A1 | 7/2006 | Mango, III et al. |
| 2006/0264717 | A1 | 11/2006 | Pesach et al. |
| 2007/0166223 | A1 | 7/2007 | Jiang et al. |
| 2008/0095694 | A1 | 4/2008 | Nakayama et al. |
| 2008/0170982 | A1 | 7/2008 | Zhang et al. |
| 2008/0260188 | A1 | 10/2008 | Kim |
| 2008/0299031 | A1 | 12/2008 | Liu et al. |
| 2009/0016951 | A1 | 1/2009 | Kawabata et al. |
| 2009/0028002 | A1 | 1/2009 | Sugiura et al. |
| 2009/0085461 | A1 | 4/2009 | Feng et al. |
| 2009/0096346 | A1 | 4/2009 | Liu et al. |
| 2009/0096348 | A1 | 4/2009 | Liu et al. |
| 2009/0145686 | A1 | 6/2009 | Watabe et al. |
| 2009/0153012 | A1 | 6/2009 | Liu et al. |
| 2009/0167136 | A1 | 7/2009 | Liu et al. |
| 2009/0167137 | A1 | 7/2009 | Liu et al. |
| 2010/0054502 | A1 | 3/2010 | Miyachi |
| 2010/0054507 | A1 | 3/2010 | Oh et al. |
| 2010/0166232 | A1 | 7/2010 | Liu et al. |
| 2011/0171419 | A1 | 7/2011 | Li et al. |

FOREIGN PATENT DOCUMENTS

| | | |
|---|---|---|
| CN | 2779422 Y | 5/2006 |
| CN | 1787696 | 6/2006 |
| CN | 2787870 | 6/2006 |
| CN | 2798479 | 7/2006 |
| CN | 1821048 | 8/2006 |
| CN | 1886820 | 12/2006 |
| CN | 1944829 | 4/2007 |
| CN | 1982209 | 6/2007 |
| CN | 101284662 | 10/2008 |
| CN | 201150134 | 11/2008 |
| CN | 101314464 | 12/2008 |
| CN | 101471213 | 7/2009 |
| CN | 101400198 | 9/2010 |
| JP | 49-24593 | 3/1974 |
| JP | 60-22900 | 2/1985 |
| JP | 1-255398 | 10/1989 |
| JP | 3-147497 | 6/1991 |
| JP | 4-126489 | 4/1992 |
| JP | 9-105788 | 4/1997 |
| JP | 11-300274 | 11/1999 |
| JP | 2001333493 | 11/2001 |
| JP | 2002-186097 | 6/2002 |
| JP | 2002346996 | 12/2002 |
| JP | 2002542136 | 12/2002 |
| JP | 2003500325 | 1/2003 |
| JP | 2003198281 | 7/2003 |
| JP | 2003-266399 | 9/2003 |
| JP | 2003-319490 | 11/2003 |
| JP | 20042103 | 1/2004 |
| JP | 2004229250 | 8/2004 |
| JP | 2005-51284 | 2/2005 |
| JP | 2005-73197 | 3/2005 |
| JP | 2005189322 | 7/2005 |
| JP | 2005-318040 | 11/2005 |
| JP | 2005-341554 | 12/2005 |
| JP | 2005333601 | 12/2005 |
| JP | 2006-180082 | 7/2006 |
| JP | 2006270041 | 10/2006 |
| JP | 2007-24688 | 2/2007 |
| JP | 2007-54831 | 3/2007 |
| JP | 2007-167118 | 7/2007 |
| JP | 2007-187976 | 7/2007 |
| JP | 2008-101910 | 5/2008 |
| JP | 2009-31031 | 2/2009 |
| JP | 2009-91239 | 4/2009 |
| JP | 2009-94074 | 4/2009 |
| JP | 2009-146896 | 7/2009 |
| JP | 2009-146898 | 7/2009 |
| JP | 2009-164125 | 7/2009 |
| KR | 10-0761548 | 9/2007 |
| TW | 200740976 | 11/2007 |
| TW | 200744399 | 12/2007 |
| TW | 201029481 | 8/2010 |
| WO | WO0073204 | 12/2000 |
| WO | WO2005102924 | 11/2005 |
| WO | WO2007049496 | 5/2007 |
| WO | WO2007052928 | 5/2007 |
| WO | WO2007099975 | 9/2007 |
| WO | WO2007111107 | 10/2007 |
| WO | WO2008/029451 | 3/2008 |

OTHER PUBLICATIONS

William Henry Preece, On Some Thermal Effects of Electric Currents, Proceedings of the Royal Society of London, 1879-1880, pp. 408-411, vol. 30.

Edward C. Wente, The Thermophone, Physical Review, 1922, pp. 333-345, vol. 19.

J.J.Hopfield, Spectra of Hydrogen, Nitrogen and Oxygen in the Extreme Ultraviolet, Physical Review, 1922, pp. 573-588, vol. 20.

Kaili Jiang, Qunqing Li, Shoushan Fan, Spinning continuous carbon nanotube yarns, Nature, Oct. 24, 2002, pp. 801, vol. 419.

Strutt John William, Rayleigh Baron, The Theory of Sound, 1926, pp. 226-235, vol. 2.

Swift Gregory W., Thermoacoustic Engines and Refrigerators, Physics Today, Jul. 1995, pp. 22-28, vol. 48.

Lin Xiao, Zhuo Chen, Chen Feng, Liang Liu et al., Flexible, Stretchable, Transparent Carbon Nanotube Thin Film Loudspeakers, Nano Letters, 2008, pp. 4539-4545, vol. 8, No. 12, US.

Kai Liu, Yinghui Sun, Lei Chen, Chen Feng, Xiaofeng Feng, Kaili Jiang et al., Controlled Growth of Super-Aligned Carbon Nanotube Arrays for Spinning Continuous Unidirectional Sheets with Tunable Physical Properties, Nano Letters, 2008, pp. 700-705, vol. 8, No. 2.

Yang Wei, Kaili Jiang, Xiaofeng Feng, Peng Liu et al., Comparative studies of multiwalled carbon nanotube sheets before and after shrinking, Physical Review B, Jul. 25, 2007, vol. 76, 045423.

Lina Zhang, Chen Feng, Zhuo Chen, Liang Liu et al., Superaligned Carbon Nanotube Grid for High Resolution Transmission Electron Microscopy of Nanomaterials, Nano Letters, 2008, pp. 2564-2569, vol. 8, No. 8.

H.D. Arnold, I.B. Crandall, The Thermophone as a Precision Source of Sound, Physical Review, 1917, pp. 22-38, vol. 10.

W. Yi, L.Lu, Zhang Dianlin et al., Linear Specific Heat of Carbon Nanotubes, Physical Review B, Apr. 1, 1999, vol. 59, No. 14, R9015-9018.

Zhuangchun Wu, Zhihong Chen, Xu Du et al.,Transparent, Conductive Carbon Nanotube Films, Science, Aug. 27, 2004, pp. 1273-1276, vol. 305.

P. De Lange, On Thermophones, Proceedings of the Royal Society of London. Series A, Apr. 1, 1915, pp. 239-241, vol. 91, No. 628.

http://www.physorg.com/news123167268.html.

Mei Zhang, Shaoli Fang, Anvar A. Zakhidov, Sergey B. Lee et al., Strong, Transparent, Multifunctional, Carbon Nanotube Sheets, Science, Aug. 19, 2005, pp. 1215-1219, vol. 309.

Braun Ferdinand, Notiz uber Thermophonie, Ann. Der Physik, Apr. 1898, pp. 358-360, vol. 65.

Frank P. Incropera, David P. Dewitt et al., Fundamentals of Heat and Mass Transfer, 6th ed., 2007, pp. A-5, Wiley:Asia.

Xiaobo Zhang, Kaili Jiang, Chen Feng, Peng Liu et al., Spinning and Processing Continuous Yarns from 4-Inch Wafer Scale Super-Aligned Carbon Nanotube Arrays, Advanced Materials, 2006, pp. 1505-1510, vol. 18.

Amos, S.W.; "Principles of Transistor Circuits"; 2000; Newnes-Butterworth-Heinemann; 9th ed.;p. 114.

Silvanus P. Thompson, The Photophone, Nature, 23, Sep. 1880, vol. XXII, No. 569, pp. 481.

Alexander Graham Bell, Selenium and the Photophone, Nature, Sep. 23, 1880, pp. 500-503.

Lee et al., Photosensitization of nonlinear scattering and photoacoustic emission from single-walled carbon nanotubes, Applied Physics Letters, 13, Mar. 2008, 92, 103122.

METHOD FOR MAKING THERMOACOUSTIC DEVICE

CROSS-REFERENCE TO RELATED APPLICATIONS

This application claims all benefits accruing under 35 U.S.C. §119 from China Patent Application No. 200910109570.3, filed on Aug. 7, 2009, in the China Intellectual Property Office. This application is a continuation application of U.S. patent application Ser. No. 12/719,816, filed on Mar. 8, 2010, entitled, "THERMOACOUSTIC DEVICES".

BACKGROUND

1. Technical Field

The present disclosure relates to thermoacoustic devices, and particularly to a method for making metal material based thermoacoustic device.

2. Description of Related Art

A thermophone based on the thermoacoustic effect was created by H. D. Arnold and I. B. Crandall (H. D. Arnold and I. B. Crandall, "The thermophone as a precision source of sound", Phys. Rev. 10, pp 22-38 (1917)). The thermophone uses a platinum strip with a thickness of $7 \times 10^{-5}$ cm as a thermoacoustic element. When signals are input into the platinum strip, heat is produced in the platinum strip according to the variations of the signal and/or signal intensity. Heat is propagated into the surrounding medium. The heat in the medium causes thermal expansion and contraction, and produces pressure waves in the surrounding medium, resulting in sound wave generation. The thermophone includes the platinum strip, clamps, and an electrical signal input device. The clamps are spaced apart from each other and are disposed on two ends of the platinum strip. The clamps are used for fixing the platinum strip. The middle region of the platinum strip is suspended while the two ends of the platinum strip are fixed. However, a suspending metal slice with thickness smaller than $7 \times 10^{-5}$ centimeter (cm) is difficult to fabricate as a result of restriction of fabrication technology, thus, a smaller heat capacity per unit area of the metal slice cannot be achieved, which leads to sounds extremely weak because the heat capacity per unit area of the metal slice is too high.

What is needed, therefore, is to provide a method for making thermoacoustic device having a high acoustic intensity.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
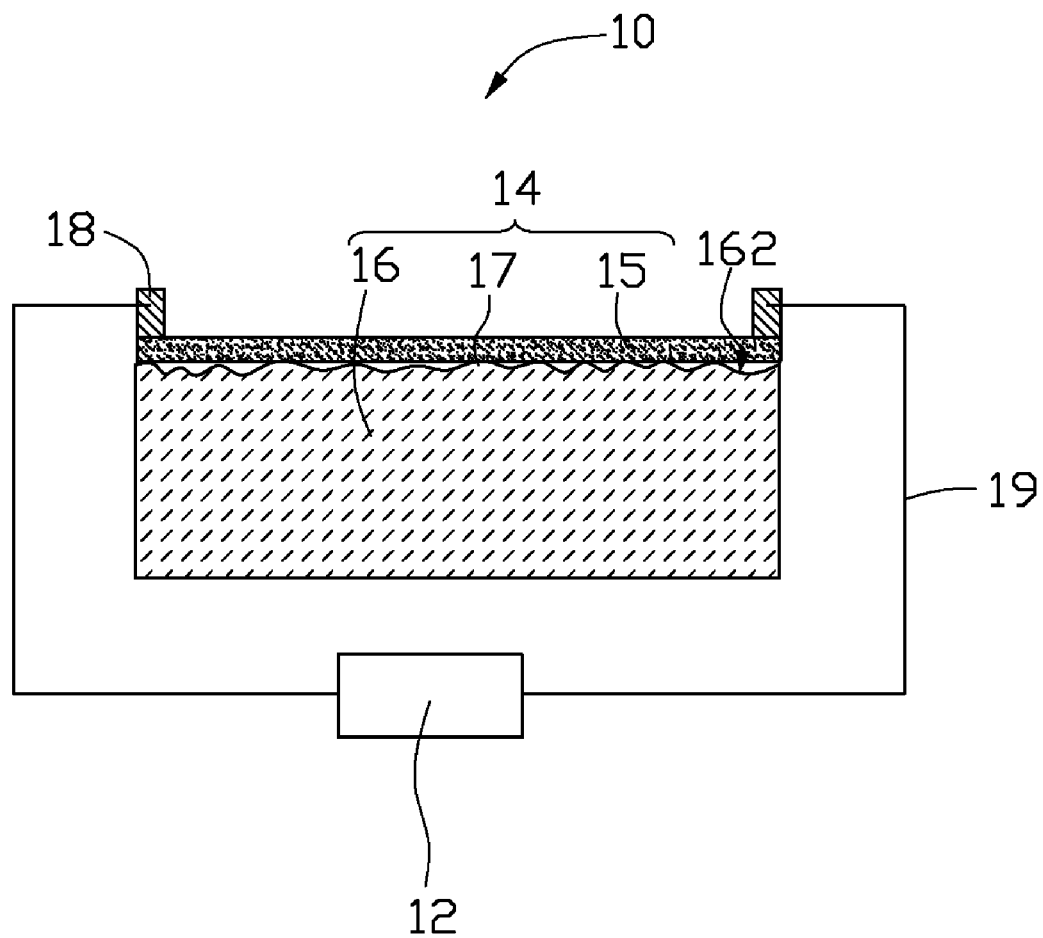
FIG. 1 is a structural schematic view of an embodiment of a thermoacoustic device.

Referring to FIG. 1, a thermoacoustic device 10 of an embodiment includes a signal input device 12, an acoustic element 14, and at least two electrodes 18.

The acoustic element 14 includes a substrate 16, a plurality of microstructures 17, and a metal film 15. The substrate 16 has a surface 162. The microstructures 17 are disposed on the surface 162. The metal film 15 is disposed on the plurality of microstructures 17. The electrodes 18 are spaced from each other and electrically connected to the metal film 15 and the signal input device 12. The electrodes 18 are used for inputting electrical signals into the acoustic element 14. The electrical signals are produced by the signal input device 12. The electrodes 18 and the signal input device 12 can be electrically connected together by a wire 19.

The substrate 16 functions as a supporting structure for supporting the microstructures 17 and the metal film 15. The shape of the substrate 16 is not limited. In one embodiment, the surface 162 has many tiny bumps that serve as the microstructures 17. The metal film 15 is disposed on the bumpy surface 162. The substrate 16 can be made of a rigid or flexible insulating material, and the material of the substrate 16 has a good thermal insulating property, thereby preventing the substrate 16 from absorbing the heat generated by the metal film 15. In some embodiments, the substrate 16 can be made of diamond, glass, quartz, plastic, or resin et al.

When a signal with great intensity is inputted the metal film 15 with a small thickness, the metal film 15 is easy to be broken because the signal with great intensity can create great heat in the metal film 15. The great heat will cause thermal expansion in the metal film 15, which make the metal film 15 with small thickness break. The plurality of microstructures 17 can support the metal film 15 to avoid the breaking of the metal film 15. Contact area of the metal film 15 with each microstructure/bump 17 can be less than or equal to 1 square millimeter ($mm^2$). About 10 to about 99 percent by area of the metal film 15 is suspended. Therefore, the metal film 15 can have a great contact area with the surrounding medium (e.g., air) and great thermal transmittance area, thereby improving acoustic effect of the thermoacoustic device 10. Distance of two adjacent contact positions between the metal film 15 and the microstructures 17 can be less than or equal to 1 mm, so that the metal film 15 can be uniformly supported by the microstructures 17, and will not be distorted under the weight of itself. The metal film 15 is supported by the microstructures 17. Therefore, signals can be input to the metal film 15 with great intensity without breaking the metal film 15, thereby making a sound with great acoustic intensity.

The metal film 15 can be made of a kind of material with a small heat capacity per unit area and good ductility, such as iron (Fe), nickel (Ni), gold (Au), copper (Cu), silver (Ag), cobalt (Co), platinum (Pt), aluminum (Al) or any combination thereof. The metal film 15 is supported by the microstructures 17, thus, the thickness of the metal film 15 can be extremely thin and have an extremely small heat capacity per unit area. In use of the thermoacoustic device 10, the metal film 15 is not easily broken, and can make sounds at a variety of frequencies and high intensity. In one embodiment, the thickness of the metal film 15 can be less than 0.7 μm, the heat capacity per unit area of the metal film 15 can be less than $2 \times 10^{-4}$ J/$cm^2$*K. The heat capacity per unit area of the metal film 15 is not only related to the material of the metal film 15 but also the thickness of the metal film 15. The thinner the metal film 15, the less the heat capacity per unit area of the metal film 15. The frequency and the intensity of the sound produced by the metal film 15 are related to the heat capacity per unit area of the metal film 15. The smaller the heat capacity per unit area, the wider the frequency range of the sound that can be produced by the metal film 15, and the higher the intensity of the sound.

The electrodes 18 are made of conductive material. The shape of the electrodes 18 is not limited and can have, for example, a lamellar, rod, wire, or block like structure. The material of the electrodes 18 can be metal, conductive adhesive, carbon nanotubes, or indium tin oxides among other conductive materials. In one embodiment, the electrodes 18 are metal rods. The electrodes 18 are configured to electrically connect the signal input device 12 to the acoustic element 14. The electrodes 18 are spaced apart from each other and disposed on the surface of the metal film 15. A conductive adhesive can be further provided between the electrodes 18 and the metal film 15. The conductive adhesive can be used to better secure and provide for electrical contact between the electrodes 18 and the metal film 15. The conductive adhesive can be silver paste. In one embodiment, the length of the electrodes 18 is equal to the width of the metal film 15, in order that audio signals are transferred to the whole metal film 15. In addition, the electrodes 18 can be optional, the signal input device 12 can directly and electrically connect to the metal film 15, thereby directly inputting the audio signals into the metal film 15.

In one embodiment, the signal input device 12 is electrically connected to the electrodes 18 by the wire 19, and inputs audio signals into the acoustic element 14 via the electrodes 18. The audio signals are conducted from one electrode 18 to the other electrode 18 in the metal film 15.

The metal film 15 has a small thickness, extremely small heat capacity per unit area, and a large specific surface area that make the metal film 15 emit sound audible to humans. In use of the thermoacoustic device 10, variable heat waves are produced in the metal film 15 according to the variations of the signal and/or signal strength. Meanwhile, the metal film 15 exchanges heat with the surrounding medium. The variable heat waves transmitted to the medium causes thermal expansion and contraction of the medium, and thus, produces pressure waves in the surrounding medium. The pressure waves result in sound wave generation. The sounds may have a wide frequency range from about 20 Hz to about 100 KHz, and sound pressure levels greater than 60 dB. The total harmonic distortion of the metal film 15 is extremely small, thus the thermoacoustic device 10 has extensive application possibilities. In one embodiment, the metal film 15 is supported by the substrate 16 and the microstructures 17, thus the metal film 15 is not easily distorted and broken, and can receive signals with high intensity. The life of the metal film 15 is relatively long.

Figure 2:
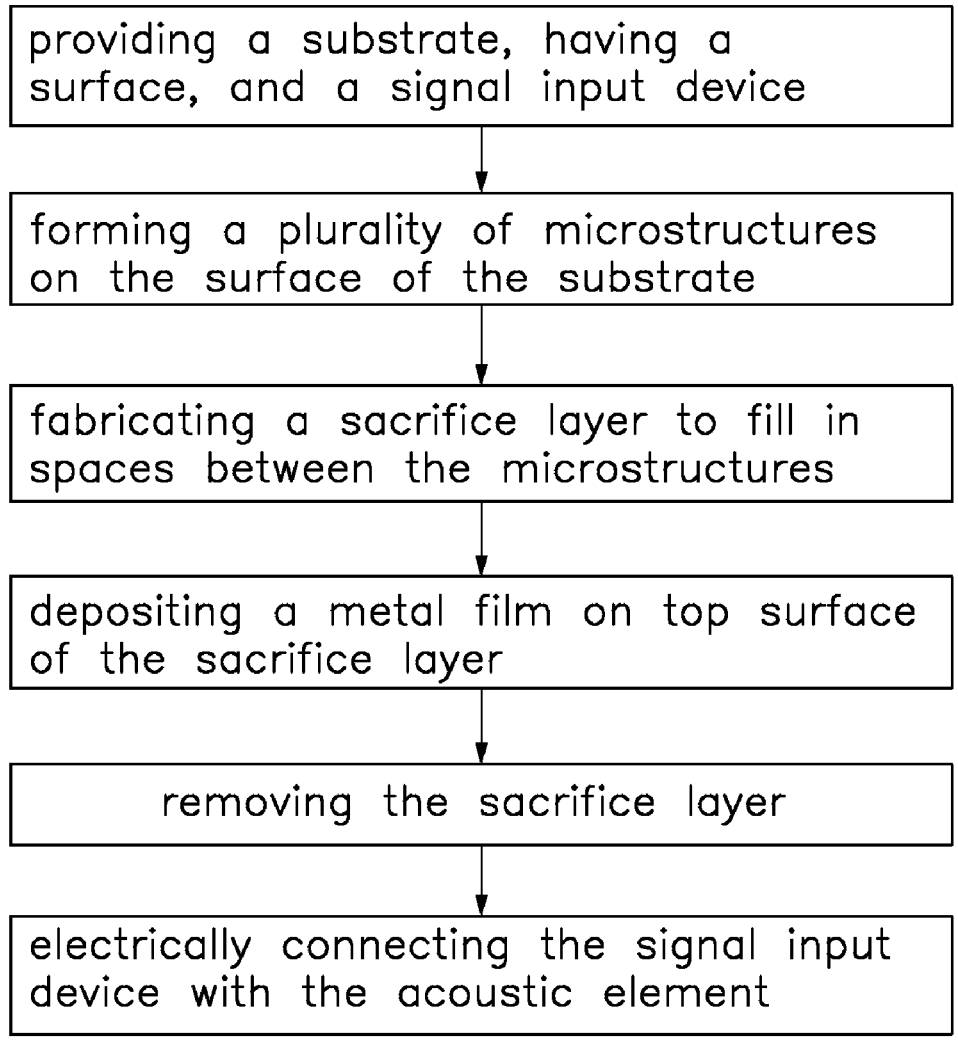
FIG. 2 is a flow chart of a method for making the thermoacoustic device.
Figure 3:
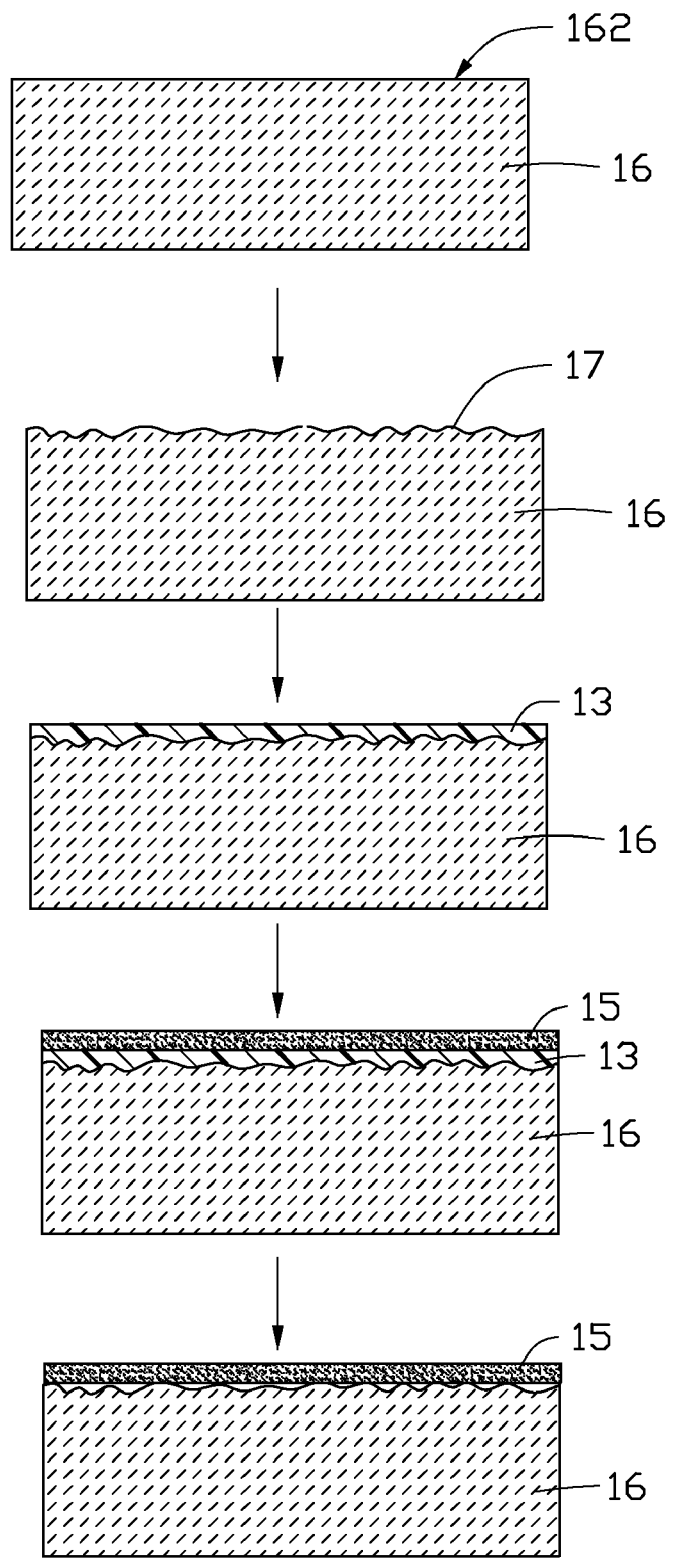
FIG. 3 shows sectional views at various stages of making the thermoacoustic device of FIG. 1.

Referring to FIGS. 2 and 3, in one embodiment, a method for making the thermoacoustic device 10 is provided, the method includes:
(a) providing a substrate 16, having a surface 162, and a signal input device 12;
(b) forming a plurality of microstructures 17 on the surface 162 of the substrate 16;
(c) fabricating a sacrifice layer 13 to fill in spaces between the microstructures 17;
(d) depositing a metal film 15 on a top surface of the sacrifice layer 13;
(e) removing the sacrifice layer 13; and
(f) electrically connecting the signal input device 12 with the acoustic element 14.

In step (b), the microstructures 17 are made by disposing the surface 162 to form a plurality of small bumps, by using a method of photo etching, ion beam etching, electron beam etching, sand blasting, milling or screen printing.

In step (c), the sacrifice layer 13 can be removed by heating or etching. The sacrifice layer 13 can be made of organic material with a low decomposing temperature. The decomposing temperature should be less than melting point of the metal film 15. In one embodiment, the sacrifice layer 13 is made of organic material that is completely decomposed below 450 degrees, such as acrylic resin or guncotton. The thickness of the sacrifice layer 13 can be less than the height of the microstructures 17.

The method for forming the sacrifice layer 13 can include steps of:
(S1) providing an organic polymer solution confected with polymer, plasticizing agent, and solvent or cosolvent proportionally.
(S2) coating the organic polymer solution on the surface 162 of the substrate 16; and
(S3) let standing for a while to solidify the organic polymer solution, thereby forming the sacrifice layer 13.

In step (S1), the polymer can include poly (isobutyl methacrylate) and crylic acid B-72 resin. The plasticizing agent can include dibutyl phthalate (DBP). The solvent can include ethyl acetate and butyl acetate. The cosolvent can include ethanol and butanol. In one embodiment, the polymer solution is confected according to table 1.

In step (S2), the coating technology can be manual or automatic. Furthermore, before coating the polymer solution, the substrate 16 can be soaked in water for about 1 minute to about 10 minutes, therefore, the surface tension of the surface 162 can be decreased, so that the polymer solution can be easily spread on the surface 162. The top surface of the sacrifice layer 13 can be polished smooth.

TABLE 1

| compositions | chemical components | amount range | amount used in embodiment |
|---|---|---|---|
| polymer | poly(isobutyl methacrylate) | 2~8 g | 6 g |
|  | crylic acid B-72 resin | 0.03~0.07 g | 0.07 g |
| plasticizing agent | dibutyl phthalate | 0.5 ml~4 ml | 1 ml |
| solvent | ethyl acetate | 50 ml~64 ml | 64 ml |
|  | butyl acetate | 15~30 ml | 21 ml |
| cosolvent | ethanol | 1 ml~3 ml | 1 ml |
|  | butanol | 1 ml~3 ml | 1 ml |

In step (d), the metal film can be made by vacuum evaporation, or magnetron sputtering. Therefore, a very thin metal film can be formed on the top surface of the sacrifice layer 13.

In step (e), in the process of decomposing of the sacrifice layer 13, the metal film 15 gradually descends under force of gravity to contact with the microstructures 17. When the sacrifice layer 13 is removed by heating, the metal film 15 and the substrate 16 should not be melted to integrate with each other. The decomposing temperature of the sacrifice layer 13 is less than the melting point of the metal film 15 and the substrate 16. When the sacrifice layer 13 is completely decomposed, the metal film 15 is suspended above the surface 162 of the substrate 16 by supporting of the microstructures 17. The resulting structure will provide for a metal film 15 having a great contact area with the air or other surrounding medium.

Furthermore, the electrodes 18 can be provided, the electrodes 18 can be adhered on surface of the metal film 15 by conductive adhesive and spaced apart from each other.

In step (f), the signal input device 12 can be a device such as an MP3 player, or power amplifier. The signal input device 12 can be directly and electrically connected to the metal film 15 by a conductive wire, or indirectly and electrically connected to the metal film 15 by electrodes 18. The signal input device 12 is electrically connected to the electrodes 18 by the wire 19.

In one embodiment, after the sacrifice layer 13 is decomposed, the metal film 15 is suspended above the surface 162 of the substrate 16 and supported by the microstructures 17. The metal film 15 can be a free-standing structure, the term "free-standing" includes, but is not limited to, a structure that does not have to be supported by a substrate and can sustain the weight of itself when it is hoisted by a portion thereof without any significant damage to its structural integrity. A portion of the metal film 15 is supported by the microstructures 17, and the rest of the metal film 15 is suspended between the microstructures 17. The metal film 15 previously supported by the sacrifice layer 13 settles to contact with and be supported by the microstructures 17 after the sacrifice layer 13 is removed. This method can prevent any damage of the extremely thin metal film 15 during the processing and leave a free-standing metal film 15 on the substrate 16. Microspaces are defined between the surface 162 and the metal film 15. The thinner the metal film 15, the smaller the heat capacity per unit area of the metal film 15. In one embodiment, the metal film 15 is extremely thin, the heat capacity per unit area of the metal film 15 is extremely small, and sound caused by the metal film 15 has a wide frequency and a great intensity. The microstructures 17 can support the metal film 15 to avoid damage, meanwhile, the metal film 15 has a great thermal transmittance area and can create sound with an ideal acoustic quality.

Figure 4:
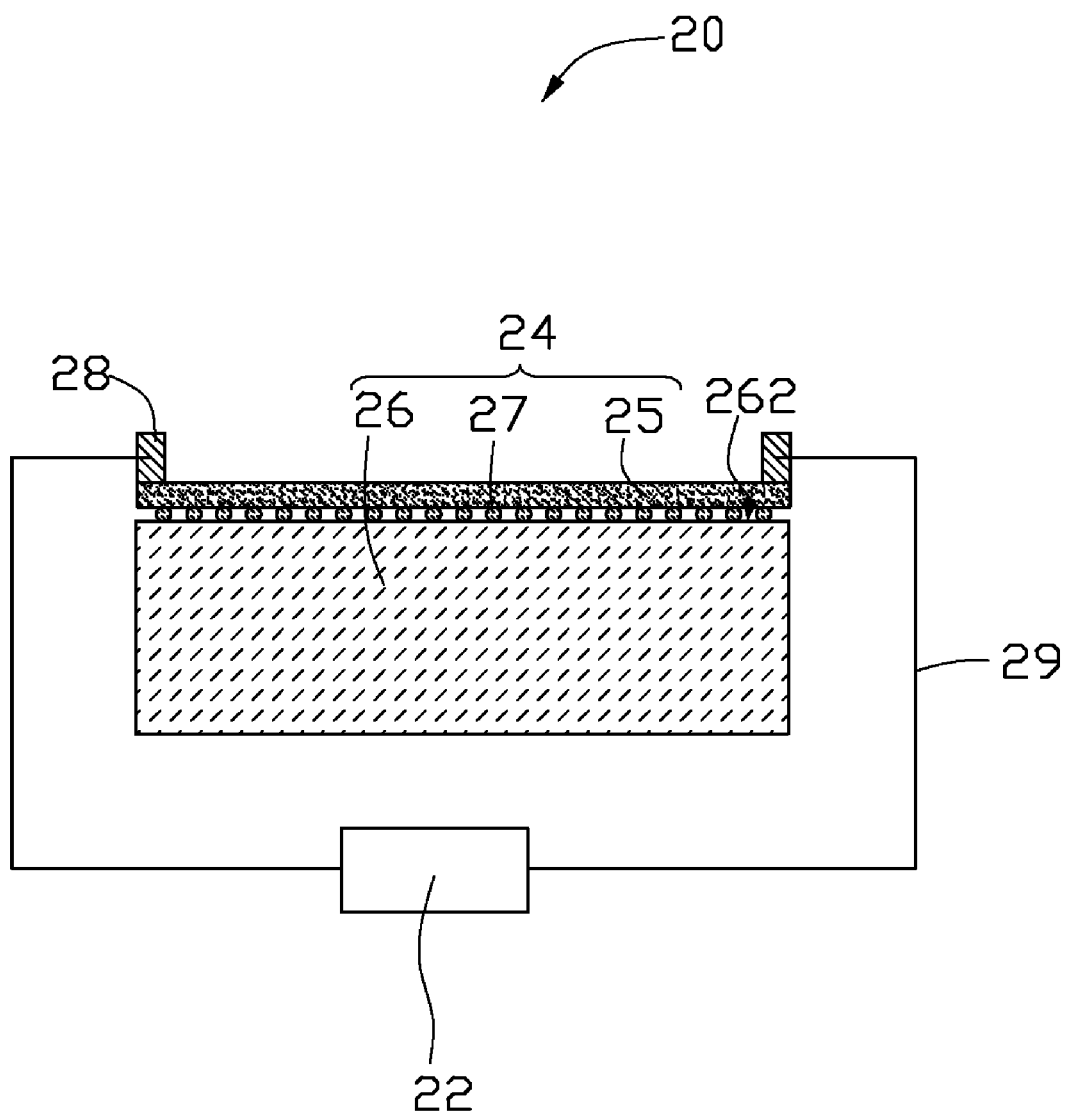
FIG. 4 is a structural schematic view of another embodiment of a thermoacoustic device.

Referring to FIG. 4, another embodiment of a thermoacoustic device 20 includes a signal input device 22, an acoustic element 24, and at least two electrodes 28. The acoustic element 24 includes a substrate 26, a plurality of microstructures 27, and a metal film 25. The substrate 26 has a surface 262. The microstructures 27 are disposed on the surface 262. The metal film 25 is disposed on the microstructures 27. The electrodes 28 are spaced from each other and electrically connected to the metal film 25. The electrodes 28 are electrically connected to the signal input device 22 by an wire 29. The electrodes 28 are used for inputting electrical signals into the acoustic element 24. The electrical signals are produced by the signal input device 22.

The plurality of microstructures 27 are a plurality of particles, and the metal film 25 is disposed on the plurality of particles.

The particles are dispersed on the surface 262 of the substrate 26. The diameter of the particles is less than or equal to 1 mm. The material of the particles is not limited. The particles can be made of rigid and thermally insulating material such as glass, quartz, or ceramic, thereby preventing the particles from absorbing heat generated by the metal film 25. An adhesive layer can be further disposed on the surface 262 of the substrate 26, and used for adhering and fixing the particles. The material of the adhesive layer is not limited.

In one embodiment, a method for making the acoustic device 20 is provided, the method includes:

(a) providing a substrate 26 having a surface 262;
(b) forming a plurality of microstructures 27 on the surface 262 of the substrate 26;
(c) fabricating a sacrifice layer to fill in spaces between the microstructures 27;
(d) depositing a metal film 25 on surface of the sacrifice layer;
(e) removing the sacrifice layer; and
(f) electrically connecting a signal input device 22 to the acoustic element 24.

In step (b), the microstructures 27 are particles, the method for forming the particles can include: (S1) coating an adhesive layer on the surface 262 of the substrate 26; and (S2) fixing the microstructures 27 on the adhesive layer. The step (S2) can further include: providing a plurality of particles; and uniformly allocating the particles on the adhesive layer, thereby forming a plurality of microstructures 27.

The metal film can be supported by the microstructures and the substrate, thus, the metal film can be extremely thin, and the metal film can receive signals with great intensity, without being broken. The thickness of the metal film can be less than or equal to 0.7 μm, the heat capacity per unit area of the metal film is less than or equal to $2\times10^{-4}$ J/cm$^2$*K, thus the sound introduced by the metal film has a wide frequency range and great intensity. The metal film is suspended above but in contact with very little of the surface of the substrate, thus, the metal film has a great contact area with the surrounding medium. In use of the thermoacoustic device, the metal film has a rapid heat exchange with surrounding medium, the heating of the medium causes thermal expansion and contraction, and produces pressure waves in the surrounding medium, resulting in sound wave generation.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a thermoacoustic device comprising:
    providing a substrate with a surface;
    forming a plurality of microspaces on the surface of the substrate;
    fabricating a sacrifice layer to fill the plurality of microspaces;
    depositing a metal film on the sacrifice layer; and
    removing the sacrifice layer, so that the metal film is suspended above the plurality of microspaces on the surface of the substrate.

2. The method as claimed in claim 1, further comprising a step of electrically connecting a signal input device with the metal film.

3. The method as claimed in claim 1, wherein the forming the plurality of microspaces on the surface of the substrate is by disposing a plurality of particles on the surface of the substrate.

4. The method as claimed in claim 3, wherein the forming the plurality of microspaces on the surface of the substrate further comprises forming an adhesive layer on the surface of the substrate before disposing the plurality of particles.

5. The method as claimed in claim 1, wherein the forming the plurality of microspaces on the surface of the substrate is performed by using a method of photo etching, ion beam etching, electron beam etching, sand blasting, milling or screen printing.

6. The method as claimed in claim 1, wherein the forming the plurality of microspaces on the surface of the substrate is performed by distributing a plurality of particles on the surface of the substrate.

7. The method as claimed in claim 6, wherein the sacrifice layer is filled in the plurality of micropaces between the particles.

8. The method as claimed in claim 1, wherein the depositing the metal film on the sacrifice layer is performed by vacuum evaporation or magnetron sputtering.

9. The method as claimed in claim 1, wherein the fabricating the sacrifice layer to fill the plurality of microspaces comprises: providing an organic polymer solution confected with a polymer, a plasticizing agent, and a solvent or a cosolvent according to a proportion; and coating the organic polymer solution on the surface of the substrate.

10. The method as claimed in claim 9, further comprises: soaking the substrate in water for about 1 minute to about 10 minutes before the coating the organic polymer solution.

11. The method as claimed in claim 1, wherein the sacrifice layer is made of an organic material with a low decomposing temperature.

12. The method as claimed in claim 11, wherein the organic material is acrylic resin or guncotton.

13. The method as claimed in claim 1, wherein the sacrifice layer is removed by heating or etching.

* * * * *